United States Patent
Han et al.

(10) Patent No.: US 10,541,281 B2
(45) Date of Patent: Jan. 21, 2020

(54) IN-CELL TOUCH ORGANIC LIGHT-EMITTING DISPLAY DEVICE

(71) Applicant: LG Display Co., Ltd., Seoul (KR)

(72) Inventors: Jong-Hyun Han, Paju-si (KR); Se-Jong Yoo, Paju-si (KR); Nack-Bong Choi, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 92 days.

(21) Appl. No.: 15/855,905

(22) Filed: Dec. 27, 2017

(65) Prior Publication Data

US 2018/0190723 A1    Jul. 5, 2018

(30) Foreign Application Priority Data

Dec. 30, 2016    (KR) .......................... 10-2016-0184382

(51) Int. Cl.
*G06F 3/045* (2006.01)
*H01L 27/32* (2006.01)
(Continued)

(52) U.S. Cl.
CPC ............ *H01L 27/323* (2013.01); *G06F 3/044* (2013.01); *G06F 3/0412* (2013.01);
(Continued)

(58) Field of Classification Search
USPC .................................. 345/76, 173, 174, 175
See application file for complete search history.

(56) References Cited

U.S. PATENT DOCUMENTS 9,239,654 B2    1/2016  Jang
9,933,872 B2    4/2018  Watanabe et al.
(Continued)

FOREIGN PATENT DOCUMENTS

CN    103376938 A    10/2013
CN    203950288 U    11/2014
(Continued)

OTHER PUBLICATIONS

Taiwan Intellectual Property Office, First Office Action, TW Patent Application No. 106146070, dated Oct. 19, 2018, 18 pages.
(Continued)

*Primary Examiner* — Thuy N Pardo
(74) *Attorney, Agent, or Firm* — Fenwick & West LLP

(57) ABSTRACT

Disclosed is a touch organic light-emitting display device that is capable of stably connecting metal mesh electrodes to each other using a plurality of bridges and of minimizing the occurrence of parasitic capacitance. The display device includes an organic light-emitting array including pixel openings and a bank insulation film, and a touch electrode array bonded to the organic light-emitting array. The touch electrode array includes first and second mesh electrodes arranged in first and second directions and having a multiple-lattice structure, bridges for connecting first mesh electrodes to each other, and connecting patterns for connecting second mesh electrodes to each other. The bridges do not overlap the second mesh electrodes but overlap the connecting patterns so as to intersect the same. The first and second mesh electrodes, the bridges and the connecting patterns overlap the bank insulation film.

19 Claims, 6 Drawing Sheets

(51) Int. Cl.
*G06F 3/044* (2006.01)
*G06F 3/041* (2006.01)

(52) U.S. Cl.
CPC .............. *G06F 2203/04111* (2013.01); *G06F 2203/04112* (2013.01); *H01L 27/3218* (2013.01); *H01L 27/3244* (2013.01)

(56) References Cited

U.S. PATENT DOCUMENTS

| | | | |
|---|---|---|---|
| 9,952,729 B2 | 4/2018 | Jang | |
| 10,042,493 B2 | 8/2018 | Sato | |
| 2013/0278513 A1 | 10/2013 | Jang | |
| 2014/0168109 A1* | 6/2014 | Kang | G06F 3/044 345/173 |
| 2014/0347319 A1* | 11/2014 | Lin | G06F 3/044 345/174 |
| 2015/0009104 A1* | 1/2015 | Kim | G09G 3/3225 345/76 |
| 2015/0185959 A1* | 7/2015 | Chen | G06F 3/044 345/175 |
| 2015/0220191 A1* | 8/2015 | Huh | G06F 3/044 345/173 |
| 2015/0234425 A1* | 8/2015 | Kim | G06F 3/0412 345/174 |
| 2015/0293634 A1* | 10/2015 | Her | G06F 3/044 345/174 |
| 2016/0048248 A1* | 2/2016 | Na | G06F 3/044 345/174 |
| 2016/0085339 A1* | 3/2016 | Yashiro | G06F 3/044 345/174 |
| 2016/0103516 A1 | 4/2016 | An | |
| 2016/0103537 A1* | 4/2016 | Park | G06F 3/0412 345/174 |
| 2016/0109998 A1 | 4/2016 | Watanabe | |
| 2016/0132158 A1 | 5/2016 | Jang | |
| 2016/0179259 A1 | 6/2016 | Watanabe et al. | |
| 2017/0108964 A1 | 4/2017 | Sato | |
| 2017/0147116 A1 | 5/2017 | Lee et al. | |
| 2018/0239465 A1 | 8/2018 | Jang | |

FOREIGN PATENT DOCUMENTS

| | | |
|---|---|---|
| JP | 2016-015013 A | 1/2016 |
| JP | 2016-081529 A | 5/2016 |
| JP | 2016-110643 A | 6/2016 |
| KR | 10-2016-0055013 A | 5/2016 |

OTHER PUBLICATIONS

Japan Patent Office, Notice of Reason for Refusal, JP Patent Application No. 2017-2536868, dated Nov. 22, 2018, seven pages.

\* cited by examiner

IN-CELL TOUCH ORGANIC LIGHT-EMITTING DISPLAY DEVICE

CROSS-REFERENCE TO RELATED APPLICATIONS

This application claims the benefit of Republic of Korea Patent Application No. 10-2016-0184382, filed on Dec. 30, 2016, which is hereby incorporated by reference in its entirety.

BACKGROUND

Field of Technology

The present disclosure relates to a touch organic light-emitting display device, and more particularly to a touch organic light-emitting display device, which is capable of preventing an increase in a time constant and the occurrence of parasitic capacitance in electrodes provided at a touch sensor.

Discussion of the Related Art

An image display device, which displays various pieces of information on a screen, is a core technology of the information and communication age, and is being developed in the direction of becoming thinner, lighter, more portable, and having higher performance. As a flat panel display device that is capable of overcoming the problems of disadvantageous weight and volume of a cathode ray tube (CRT), for example, an organic light-emitting display device, which displays an image by controlling the intensity of luminescence of an organic emission layer, is attracting attention.

The organic light-emitting display device described above uses a self-illuminating organic light-emitting element, and therefore does not require a separate light source and enables realization of a super-thin-type display. Therefore, in recent years, research on a touch-panel-integrated display device having an in-cell touch structure, which uses an organic light-emitting element and includes a touch electrode array inside a light-emitting cell, has been actively conducted.

A touch panel includes a first touch electrode, which is arranged in a first direction, and a second touch electrode, which is arranged in a second direction so as to intersect the first touch electrode. The first touch electrode and the second touch electrode are electrically isolated from each other, and one thereof may serve as a driving electrode for applying a touch signal while the other thereof may serve as a sensing electrode for sensing a touch by sensing a change in capacitance due to touch.

In manufacturing an organic light-emitting display device having a flexible touch structure, research is being actively conducted into the application of metal mesh electrodes, having superior flexibility and low resistance characteristics, to touch electrodes. However, because the metal mesh electrodes have higher reflectivity than a transparent conductive material, there is a high possibility of such electrodes being visible to the outside, and consequently, there is a problem of deterioration of the overall brightness of the organic light-emitting display device.

To solve this problem, a method of aligning metal mesh electrodes with a bank, which is a non-light-emitting region, has been devised so as to prevent the metal mesh electrodes from being visible.

The first touch electrode includes a plurality of first mesh electrodes, which are arranged in a first direction and are electrically connected to each other. The second touch electrode includes a plurality of second mesh electrodes, which are arranged in a second direction and are electrically connected to each other. The first mesh electrodes may be electrically connected to other first mesh electrodes, which are positioned adjacent thereto in the first direction, via the bridges. The second mesh electrodes may be electrically connected to other second mesh electrodes, which are positioned adjacent thereto in the second direction, via connecting patterns provided below the bridges.

At this time, in order to prevent the bridges from being visible to the outside, the bridges are formed on the bank, which is a non-light-emitting region, so as to overlap the same, like the metal mesh electrodes.

However, if the bridges are damaged, for example, cut off, the mesh electrodes may be electrically disconnected from each other, and accordingly, touch-sensing failure may occur. Even if neighboring mesh electrodes are connected to each other using a plurality of bridges in an attempt to solve this problem, because the metal mesh electrodes overlap mesh electrodes positioned thereunder, with an insulation layer interposed therebetween, parasitic capacitance may occur.

If parasitic capacitance occurs between the bridges and the metal mesh electrodes, a time constant is increased, an RC delay occurs, and consequently, a delay in transmitting a touch-sensing signal occurs. Further, overall capacitance of the touch electrode is also increased due to the parasitic capacitance between the bridges and the metal mesh electrodes, and consequently, touch sensitivity is deteriorated.

SUMMARY

Accordingly, the present disclosure is directed to a touch organic light-emitting display device that substantially obviates one or more problems due to limitations and disadvantages of the related art.

An object of the present disclosure is to provide a touch organic light-emitting display device, which is capable of stably connecting metal mesh electrodes to each other using a plurality of bridges and of minimizing the occurrence of parasitic capacitance.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a touch organic light-emitting display device includes an organic light-emitting array including a plurality of pixel openings and a bank insulation film, the bank insulation film between the plurality of pixel openings; and a touch electrode array coupled to the organic light-emitting array, the touch electrode array including: a plurality of first mesh electrodes arranged in a first direction, the plurality of first mesh electrodes comprising a multiple-lattice structure; a plurality of second mesh electrodes in a same layer of the touch-organic light-emitting display device as the plurality of first mesh electrodes, the plurality of second mesh electrodes electrically insulated from the plurality of first mesh electrodes and arranged in a second direction that intersects the first direction, and the plurality of second mesh electrodes comprising a multiple-lattice structure; a plurality of bridges in a different layer of the touch-organic light-emitting display device from the plurality of first mesh electrodes, the plurality of bridges arranged in the first direction and electrically connecting together the plurality of first mesh electrodes via contact holes; and a plurality of connecting patterns arranged in the second direction, the plurality of connecting patterns electrically connecting together the plurality of second mesh electrodes, and wherein the plurality of bridges overlap the plurality of connecting patterns, but do not overlap the plurality of second mesh electrodes.

In one embodiment, a touch electrode array comprises: a plurality of first mesh electrodes arranged in a first direction, the plurality of first mesh electrodes comprising a multiple-lattice structure; a plurality of second mesh electrodes in a same layer of the touch electrode array as the plurality of first mesh electrodes, the plurality of second mesh electrodes electrically insulated from the plurality of first mesh electrodes and arranged in a second direction that intersects the first direction, and the plurality of second mesh electrodes comprising a multiple-lattice structure; a plurality of bridges in a different layer of the touch electrode array from the plurality of first mesh electrodes, the plurality of bridges arranged in the first direction and electrically connecting together the plurality of first mesh electrodes via contact holes; and a plurality of connecting patterns arranged in the second direction, the plurality of connecting patterns electrically connecting together the plurality of second mesh electrodes, and wherein the plurality of bridges overlap the plurality of connecting patterns, but do not overlap the plurality of second mesh electrodes.

In one embodiment, a touch electrode array comprises: a first plurality of mesh electrodes arranged in a first direction, the first plurality of mesh electrodes including a first mesh electrode and a second mesh electrode each having a lattice structure, the first mesh electrode not directly connected to the second mesh electrode; a second plurality of mesh electrodes in a same layer of the touch electrode array as the first plurality of first mesh electrodes, the second plurality of second mesh electrodes electrically insulated from the first plurality of mesh electrodes and arranged in a second direction that intersects the first direction, and the second plurality of mesh electrodes including a lattice structure; and a plurality of bridges in a different layer of the touch electrode array from the plurality of first mesh electrodes, the plurality of bridges including a first bridge and a second bridge, the first bridge and the second bridge electrically connecting together the first mesh electrode and the second mesh electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Figure 1:
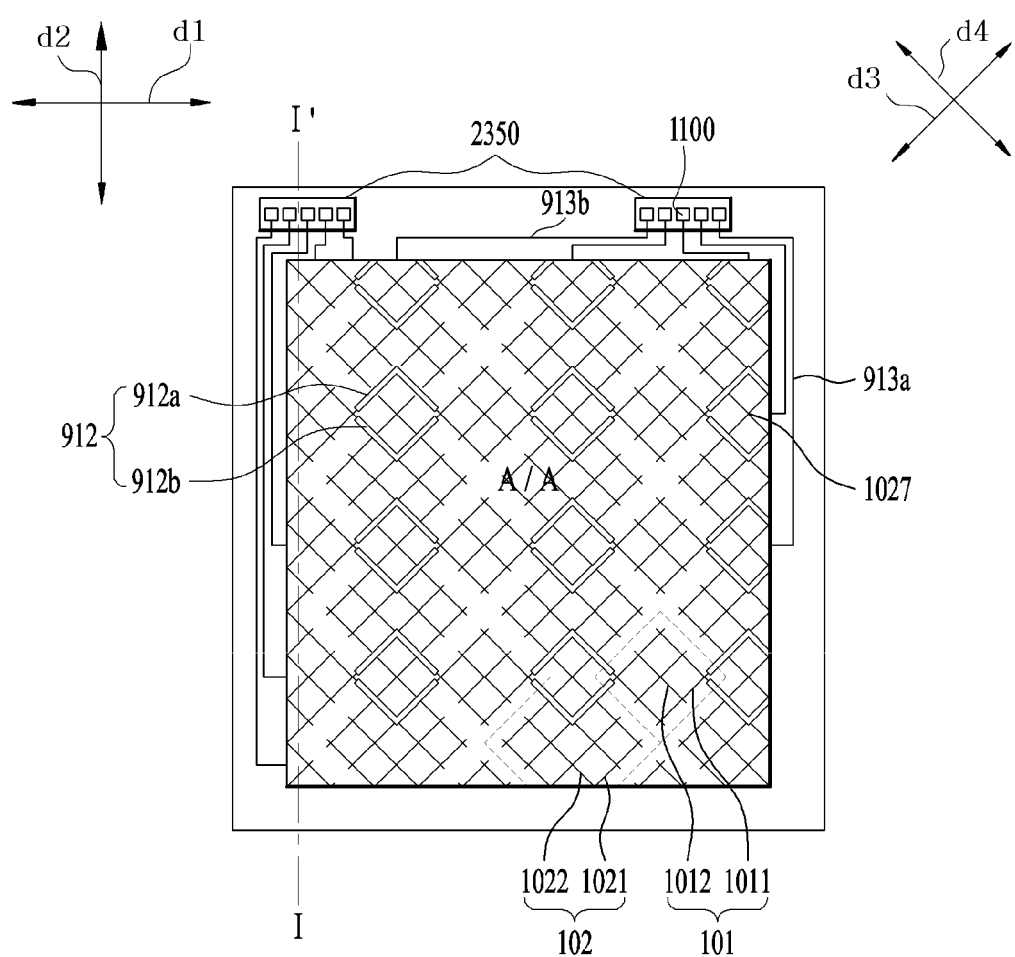
FIG. 1 is a schematic view for explaining a touch organic light-emitting display device according to the present disclosure.

Hereinafter, exemplary embodiments of the present disclosure will be described with reference to the accompanying drawings. Wherever possible, the same reference numbers will be used throughout the drawings to refer to the same or like parts. In addition, in the following description of the embodiments, a detailed description of known functions and configurations incorporated herein will be omitted when it may make the subject matter of the present invention rather unclear. Also, the terms of constituent elements used in the following description are defined taking into consideration ease in the preparation of the specification, and may differ from the terms used to describe elements of actual products.

In the description related to a positional relationship, for example, when an element is referred to as being "on", "above", "under" or "beside" another element, it can be directly on the other element, or intervening elements may also be present.

It will be understood that although the terms "first", "second", "third", etc., may be used herein to describe various elements, these elements should not be limited by these terms. These terms are only used to distinguish one element from another element. Thus, a first element discussed below could be termed a second element without departing from the teachings of example embodiments.

In the drawings, the size and thickness of each constituent element are illustrated merely for convenience of description, and the present invention is not necessarily limited to the illustrated size and thickness of each constituent element.

FIG. 1 is a schematic view for explaining a touch organic light-emitting display device according to the present disclosure.

A touch organic light-emitting display device according to the present disclosure includes a touch electrode array mounted therein, which includes a plurality of first mesh electrodes 101, which are arranged on a substrate in a first direction d1, and a plurality of second mesh electrodes 102, which are arranged in a second direction d2, which intersects the first direction d1. In this embodiment, the first direction d1 is defined as the x-axis direction and the second direction d2 is defined as the y-axis direction; however, the embodiment is not limited thereto.

Here, the first mesh electrodes 101 and the second mesh electrodes 102 are electrically insulated from each other. The first mesh electrodes 101, which are adjacent to each other in the first direction d1, are electrically connected to each other, and the second mesh electrodes 102, which are adjacent to each other in the second direction d2, are electrically connected to each other.

Each of the first mesh electrodes 101 and the second mesh electrodes 102 has a multiple-lattice structure. Each of the first mesh electrodes 101 includes a plurality of first line electrodes 1011, which are formed lengthwise in a third direction d3, which is different from the first and second directions d1 and d2, and a plurality of second line electrodes 1012, which are formed lengthwise in a fourth direction d4 and intersect the first line electrodes 1011 so as to form the lattice structure. At this time, the third direction d3 may be, for example, a diagonal direction, which makes an angle of 45° with respect to the x-axis, and the fourth direction d4 may be, for example, a diagonal direction, which makes an angle of 135° with respect to the x-axis and is therefore at right angles to the third direction d3.

Each of the second mesh electrodes 102 includes a plurality of third line electrodes 1021, which are formed lengthwise in the third direction d3, and a plurality of fourth line electrodes 1022, which are formed lengthwise in the fourth direction d4 and intersect the third line electrodes 1021 so as to form the lattice structure.

The first mesh electrodes 101, which are adjacent to each other in the first direction d1, are connected to each other via bridges 912. Although only two bridges 912a and 912b are illustrated in FIG. 1 for convenience of explanation, the number of bridges 912 is not limited to two. The neighboring first mesh electrodes 101 may be connected to each other via a greater number of bridges 912, for example, three to ten bridges 912.

The second mesh electrodes 102, which are adjacent to each other in the second direction d2, are connected to each other via connecting patterns 1027.

Here, the first mesh electrodes 101 connected in the first direction d1 via the bridges 912 may serve as driving electrodes that apply a driving signal for sensing a touch signal, and the second mesh electrodes 102 connected in the second direction d2 via the connecting patterns 1027 may serve as sensing electrodes that sense a touch signal, or vice versa; however, the embodiment is not limited thereto.

Although not illustrated in detail in FIG. 1, the bridges 912a and 912b are formed so as not to overlap the second mesh electrodes 102, and are formed so as to intersect only the connecting patterns 1027. The concrete structures of the first and second mesh electrodes 101 and 102 and the connection relationship therebetween will be described later.

The first mesh electrodes 101, which are positioned at the outermost portion of a display area A/A, are connected to pad electrodes 1100 of a touch pad portion 2350 via first routing lines 913a, and the second mesh electrodes 102, which are positioned at the outermost portion of the display area A/A, are connected to the pad electrodes 1100 of the touch pad portion 2350 via second routing lines 913b.

Figure 2:
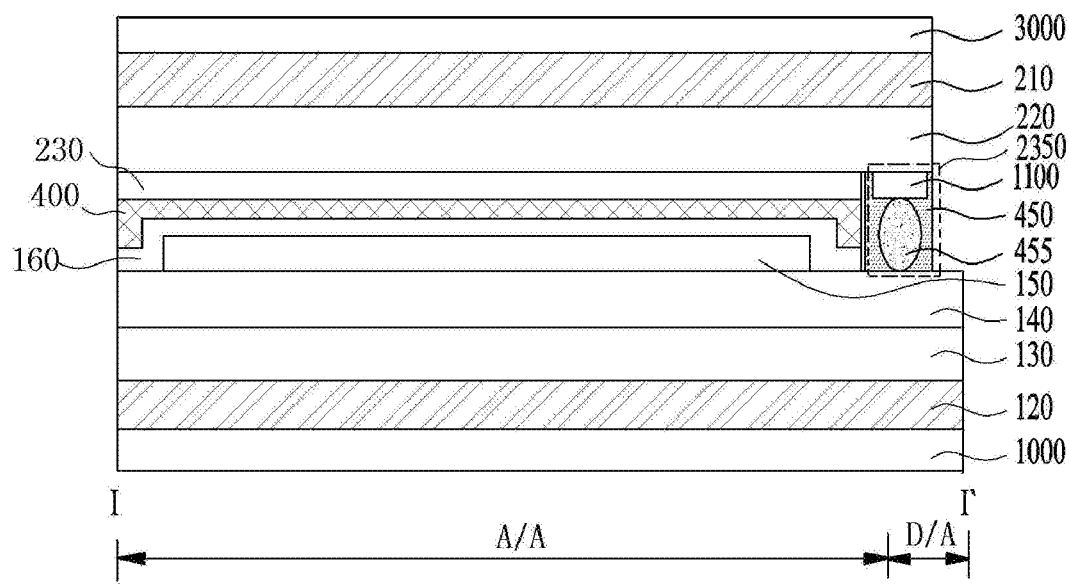
FIG. 2 is a schematic sectional view taken along line I-I' in FIG. 1 according to the present disclosure.

FIG. 2 is a schematic sectional view taken along line I-I' in FIG. 1.

The display device according to the embodiment of the present disclosure is constructed such that a first base 120, a first buffer layer 130, a thin-film transistor array 140 and an organic light-emitting array 150 are sequentially disposed on the substrate 1000 and such that a protective layer 160 is disposed so as to cover the organic light-emitting array 150. A second base 210, a second buffer layer 220 and a touch electrode array 230 are arranged inside a cover window 3000. The touch electrode array 230 is bonded to the protective layer 160, which is disposed on the organic light-emitting array 150, by means of an adhesive layer 400 so as to be opposite the organic light-emitting array 150.

In each of the first buffer layer 130 and the second buffer layer 220, an active area and a dead area are defined. The touch electrode array 230, the organic light-emitting array 150, and the thin-film transistors in the thin-film transistor array 140 excluding the pad portion are formed in the active area. In addition, a touch pad portion 2350 and the pad portion of the thin-film transistor array 140 are defined in a portion of the dead area.

Here, the first and second bases 120 and 210 serve to prevent damage to the internal arrays during a laser irradiation or etching process. In some cases, the substrate 1000 and the cover window 3000 are omitted, and the first and second bases 120 and 210 serve to protect the display device from external shocks. The first and second bases 120 and 210 may be formed of a polymer material such as, for example, polyimide or photoacryl. The first and second bases 120 and 210 may be replaced by substrates formed of a glass or polymer material, or may be omitted depending on the design.

Each of the first buffer layer 130 and the second buffer layer 220 is formed by sequentially stacking the same type of inorganic films, such as an oxide film ($SiO_2$) or a nitride film ($SiN_x$), one above another, or by alternately stacking different inorganic films one above another. The first and second buffer layers 130 and 210 function as barriers that prevent moisture or outside air from permeating the organic light-emitting array 150 in the subsequent process of bonding the upper substrate to the lower substrate.

The touch electrode array 230 and the touch pad portion 2350 are formed on the same surface of the second buffer layer 220. The pad electrodes 1100 of the touch pad portion 2350 are connected to the pad portion (not illustrated) of the thin-film transistor array 140 by a seal 450 including conductive balls 455, in a vertical bonding process using the adhesive layer 400. At this time, the adhesive layer 400 has a moisture permeation preventing function and is directly in contact with the protective layer 160, which covers the organic light-emitting array 150, thereby serving to prevent outside air from entering the organic light-emitting array 150 and to more reliably prevent the permeation of moisture, in addition to the function of the protective layer 160.

Here, the thin-film transistor array 140 including the pad portion may be configured so as to protrude further than one side of the touch electrode array 230. A driving integrated circuit (IC) (not illustrated) may be provided on the protruding portion of the thin-film transistor array 140 to transmit signals for driving the touch electrode array, the thin-film transistor array, and the organic light-emitting array. Although not illustrated, with regard to the driving IC and the thin-film transistor array, a driving pad and a dummy pad include a plurality of dummy electrodes and are connected to the driving IC via wires. In addition, after glass removal, the driving IC may be bonded to and connected to a flexible printed circuit board (FPCB) (not illustrated), thereby being controlled by a micro control unit (MCU) (not illustrated) and a timing controller (not illustrated) provided in the FPCB. The dummy pad is formed in the same layer as the metal that forms a gate line or a data line in the area that corresponds to the touch pad portion 2350 in the dead area around the active area.

The driving IC may be mounted on the flexible circuit film in a chip-on-film (COF) manner.

Although not illustrated, the dummy pad and the driving pad of the thin-film transistor array are connected to the FPCB via wires (not illustrated). In addition, the FPCB may further include a controller (not illustrated) for controlling the driving IC.

The dummy pad is formed in the same layer as the metal that forms a gate line or a data line in the area that corresponds to the touch pad portion in the dead area around the active area.

Figure 3:
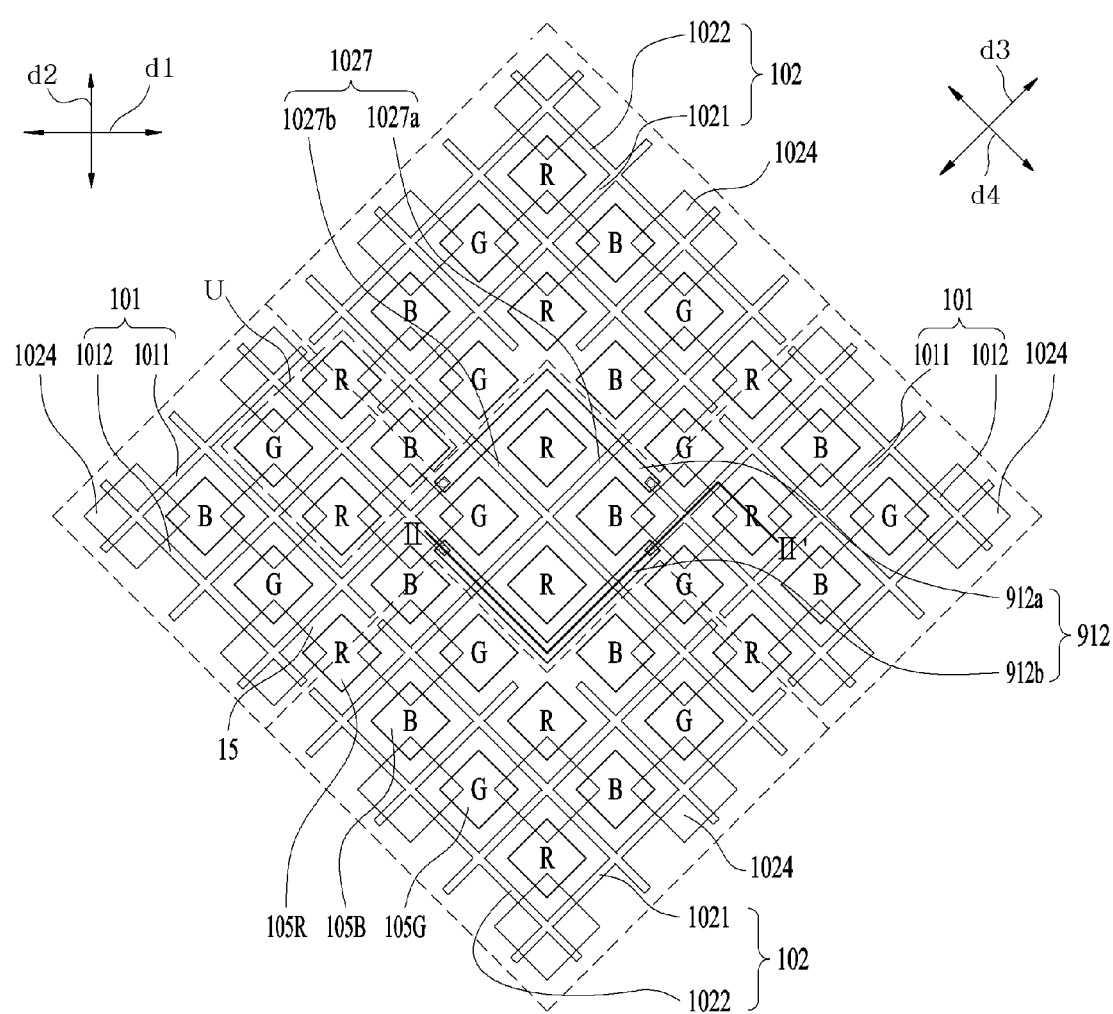
FIG. 3 is a schematic view for explaining the characteristics of first mesh electrodes, second mesh electrodes, bridges, and connecting patterns and the connection relationship there among according to a first embodiment of the present disclosure.

FIG. 3 is a schematic view for explaining the characteristics of the first mesh electrodes 101, the second mesh electrodes 102, the bridges 912 and the connecting patterns 1027, which are provided at the touch electrode array 230, and the connection relationship thereamong according to the first embodiment of the present invention.

The touch electrode array 230 is provided with the first mesh electrodes 101, the second mesh electrodes 102, the bridges 912 and the connecting patterns 1027. Each of the first mesh electrodes 101, as described above, includes the first and second line electrodes 1011 and 1012, which are arranged in the third and fourth directions d3 and d4 so as to intersect each other. Each of the second mesh electrodes 102 includes the third and fourth line electrodes 1021 and 1022, which are arranged in the third and fourth directions d3 and d4 so as to intersect each other. The first to fourth line electrodes 1011, 1012, 1021 and 1022 may be formed in the same layer using the same material. At this time, in the case in which the first and second mesh electrodes 101 and 102 are formed of a metal material, as described above, there is an advantage of ensuring high flexibility and low resistance characteristics.

Here, the first line electrodes 1011 and the second line electrodes 1012 are electrically connected to each other by intersecting each other, and the third line electrodes 1021 and the fourth line electrodes 1022 are electrically connected to each other by intersecting each other. The first and second line electrodes 1011 and 1012 are spaced apart from the third and fourth line electrodes 1021 and 1022. As described above, since the first mesh electrodes 101 and the second mesh electrodes 102 are electrically insulated from each other, the first and second line electrodes 1011 and 1012, which compose the first mesh electrodes 101, and the third and fourth line electrodes 1021 and 1022, which compose the second mesh electrodes 102, are electrically insulated from each other.

The first and second mesh electrodes 101 and 102 are positioned so as not to overlap pixel openings 105R, 105G and 105B in the organic light-emitting array 150. That is, the first and second mesh electrodes 101 and 102 are disposed on a bank insulation film 15, which is provided at a region between the pixel openings 105R, 105G and 105B in the organic light-emitting array 150. Each of the pixel openings 105R, 105G and 105B defines a light emitting portion of each of red, green, and blue organic light emitting elements. The pixel openings 105R, 105G and 105B are positioned so as to overlap the regions that are defined by the intersection between the first line electrodes 1011 and the second line electrodes 1012. Accordingly, since the first and second mesh electrodes 101 and 102 are formed so as not to block the pixel openings 105R, 105G and 105B, the first and second mesh electrodes 101 and 102 are not visible to a user.

Each of the connecting patterns 1027 may include a first connecting line electrode 1027a, which extends in the same direction as the third line electrodes 1021, i.e. the third direction d3, and a second connecting line electrode 1027b, which extends in the same direction as the fourth line electrodes 1022, i.e. the fourth direction d4. The first and second connecting line electrodes 1027a and 1027b may be formed simultaneously with the third and fourth line electrodes 1021 and 1022 using the same material.

The connecting patterns 1027 connect the second mesh electrodes 102, which are adjacent to each other in the second direction d2, to each other. That is, the connecting patterns 1027 may serve as passages through which touch signals are transmitted between the second mesh electrodes 102, which are adjacent to each other in the second direction d2.

The connecting patterns 1027 are also positioned so as not to overlap the pixel openings 105R, 105G and 105B. Although not illustrated in FIG. 3, the first and second connecting line electrodes 1027a and 1027b, which compose the connecting patterns 1027, are provided in a plural number so as to intersect each other, thereby forming a mesh pattern. The mesh pattern of the connecting patterns 1027 is also provided so as not to overlap the pixel openings 105R, 105G and 105B.

Although it is illustrated in FIG. 3 that each of the pixel openings 105R, 105G and 105B is formed in a diamond shape, the embodiment is not limited thereto. The pixel openings 105R, 105G and 105B may be formed in various other shapes, for example, a rectangular shape, a square shape, a triangular shape or a parallelogram shape, depending on the design.

The first to fourth line electrodes 1011, 1012, 1021 and 1022 and the first and second connecting line electrodes 1027a and 1027b may be formed of metal selected from among copper Cu, silver Ag, aluminum Al, molybdenum Mo, Ti and gold Au, or an alloy thereof; however, the embodiment is not limited thereto. As described above, the first and second line electrodes 1011 and 1012 form the first mesh electrodes 101 through electrical connection to each other. The third and fourth line electrodes 1021 and 1022 form the second mesh electrodes 102 through electrical connection to each other. As a result of the first mesh electrodes 101 being electrically insulated from the second mesh electrodes 102, the first and second line electrodes 1011 and 1012 are electrically insulated from the third and fourth line electrodes 1021 and 1022.

Segment electrodes 1024 may be further provided at the regions at which the first line electrodes 1011 and the second line electrodes 1012 intersect each other and at the regions at which the third line electrodes 1021 and the fourth line electrodes 1022 intersect each other.

The segment electrodes 1024 may be formed of a transparent conductive material such as, for example, indium tin oxide ITO, indium zinc oxide IZO, indium gallium zinc oxide IGZO or zinc oxide ZnO. The segment electrodes 1024 may be omitted depending on the design, or may be formed only at the portions of the regions at which the first line electrodes 1011 and the second line electrodes 1012 intersect each other and at the portions of the regions at which the third line electrodes 1021 and the fourth line electrodes 1022 intersect each other. Since the segment electrodes 1024 are formed of a transparent conductive material, they do not block the pixel openings 105R, 105G and 105B and are formed in a plane shape. Therefore, the plane-shaped segment electrodes 1024 may compensate for the resistance components of the first and second mesh electrodes 101 and 102, which are formed in a linear shape and may therefore have high resistance characteristics due to the relatively small cross-sectional area thereof.

The bridges 912a and 912b are provided in a plural number. Although only two bridges, i.e. the first bridge 912a and the second bridge 912b, are illustrated in FIG. 3, more bridges may actually be provided between the first mesh electrodes 102. As described above, in the case in which the number of bridges 912a and 912b is increased, even though some of the bridges 912a and 912b are electrically disconnected, signals are transmitted between the first mesh electrodes 102 via other normal bridges, thereby improving the reliability of touch sensing. Meanwhile, as the number of bridges 912a and 912b is increased, parasitic capacitance is increased, and accordingly, a delay in sensing a touch and deterioration in the touch-sensing characteristics due to an increase in the time constant may occur.

In order to solve this problem, a portion of the second mesh electrodes 102 that is positioned so as to overlap the bridges 912a and 912b is removed. That is, the bridges 912a and 912b and the second mesh electrodes 102 do not overlap each other. However, in order to connect neighboring second mesh electrodes 102 to each other, the connecting patterns 1027 include a portion that overlaps the bridges 912a and 912b. In order to minimize the overlapping area between the bridges 912a and 912b and the connecting patterns 1027, the connecting patterns 1027 overlap the bridges 912a and 912b in the manner of intersecting the same.

In other words, the bridges 912a and 912b have the characteristics of overlapping and intersecting with only the connecting patterns 1027, out of the connecting patterns 1027 and the second mesh electrodes 102. Therefore, in the in-cell touch organic light-emitting display device according to the present disclosure, as the result of the bridges 912a and 912b and the second mesh electrodes 102 not overlapping each other, parasitic capacitance does not occur between the bridges 912a and 912b and the second mesh electrodes 102. In addition, since the overlapping area between the second mesh electrodes 102 and the connecting patterns 1027 is minimized, the occurrence of parasitic capacitance is also minimized.

Figure 4:
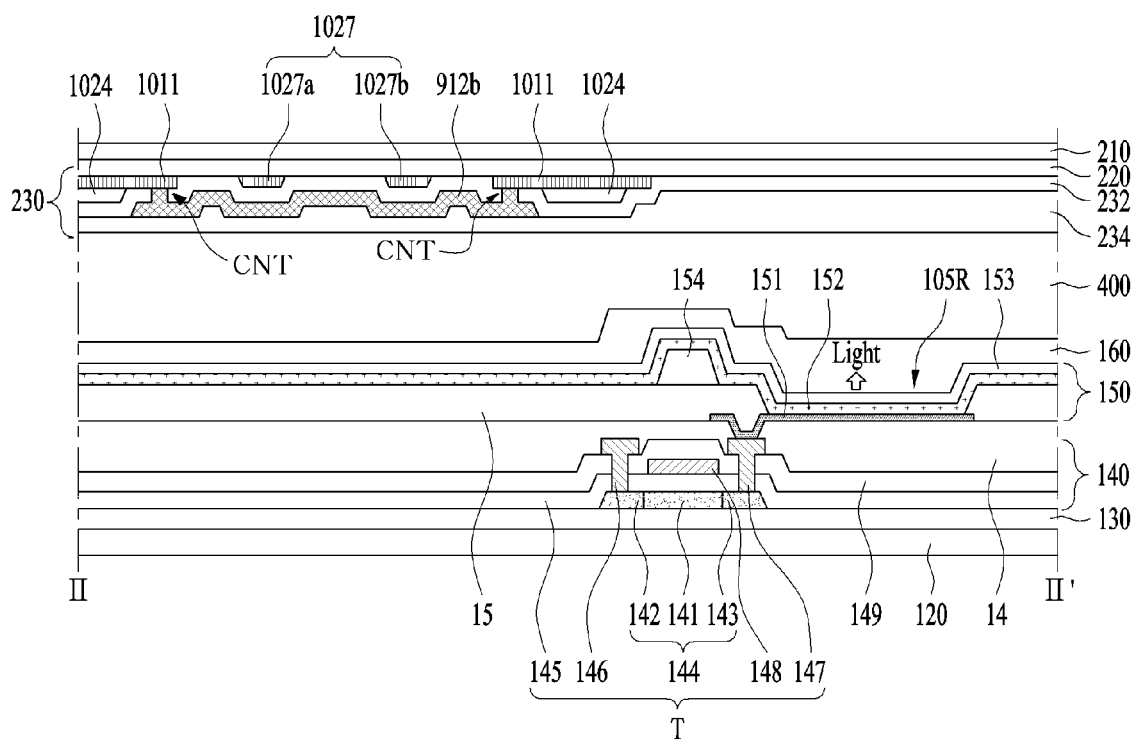
FIG. 4 is a sectional view taken along line II-II' in FIG. 3 according to the present disclosure.

FIG. 4 is a sectional view taken along line II-II' in FIG. 3. In the description made with reference to FIG. 4, both the first line electrodes 1011 and the second line electrodes 1012 will be referred to as the first mesh electrodes 101.

Referring to FIG. 4, the first buffer layer 130 is disposed on the first base 120. The thin-film transistor array 140, which includes a thin-film transistor T, is disposed on the first buffer layer 130. The thin-film transistor T includes an active layer 144, which includes a channel region 141, a source region 142 and a drain region 143, a gate insulation film 145 and a gate electrode 148, which are disposed on the active layer 144, an interlayer insulation film 149, which covers the active layer 144 and the gate electrode 148 and has contact holes formed to expose the source and drain regions 142 and 143 therethrough, and a source electrode 146 and a drain electrode 147, which are formed so as to contact the source and drain regions 142 and 143 through the contact holes. A first passivation layer 14 is formed on the thin-film transistor T. The first passivation layer 14 has contact holes formed to expose the drain electrode 147 therethrough.

A first electrode 151, which is connected to the contact holes, is disposed on the first passivation layer 14. Further, a bank insulation film 15, which defines the pixel openings 105R by exposing a portion of the first electrode 151, is disposed on the first passivation layer 14. A spacer 154 may be further disposed on the bank insulation film 15.

An organic layer 152, which includes an emission layer, is formed on the first electrode 151 of the pixel opening 105R. Here, the organic layer 152 is divided into an electron injection layer (EIL), an electron transport layer (ETL), an emission layer (EML), a hole transport layer (HTL), and a hole injection layer (HIL). The emission layer emits light having a specific wavelength as excitons, which are generated by recombination of electrons from a cathode and holes from an anode, return to the ground state.

The organic layer 152 may be formed on the entire surface of the buffer layer 130 including the bank insulation film 154 as well as the first electrode 151. However, the embodiment is not limited thereto.

A second electrode 153 is formed on the organic layer 152. The second electrode 153 may be formed on the entire surface of the buffer layer 130 including the organic layer 152.

The organic light-emitting array 150 is protected from outside moisture by the protective layer 160. The protective layer 160 may be formed by alternately stacking inorganic films and organic films. However, the embodiment is not limited thereto.

The touch electrode array 230 is disposed on the inner surface of the second buffer layer 220. The touch electrode array 230 is bonded to the organic light-emitting array 150 by the adhesive layer 400 so as to be opposite the organic light-emitting array 150.

The first mesh electrodes 101 are disposed on the second buffer layer 220 so as to be opposite the organic light-emitting array 150. Although not illustrated in FIG. 4 the second mesh electrodes 102 are disposed in the same layer as the first mesh electrodes 101. Neighboring second mesh electrodes 102 are connected to each other by the connecting patterns 1027. As described above, the connecting patterns 1027 are formed in the same layer as the second mesh electrodes 102 using the same material.

As described above, the first and second mesh electrodes 101 and 102 and the connecting patterns 1027 do not overlap the pixel openings 105R, 105G and 105B, but overlap the bank insulation film 15. It can be seen from FIG. 4 that the first mesh electrodes 101 do not overlap the pixel openings 105R. Accordingly, the first mesh electrodes 101, the second mesh electrodes 102 and the connecting patterns 1027 are not visible to the user.

The segment electrodes 1024 may be provided so as to be in contact with the first and second mesh electrodes 101 and 102. It can be seen from FIG. 4 that the segment electrodes 1024 are in contact with the first mesh electrodes 101 on the first mesh electrode 101. Although not illustrated in FIG. 4, the segment electrodes 1024 may also be provided so as to be in contact with the second mesh electrodes 102 on the second mesh electrode 102.

Here, as described above, the segment electrodes 1024 are positioned so as to be in contact with the regions at which the first line electrodes 1011 and the second line electrode 1012 intersect each other and the regions at which the third line electrodes 1021 and the fourth line electrodes 1022 intersect each other. Since the segment electrodes 1024 are formed of a transparent conductive material, it does not matter if the segment electrodes 1024 overlap the pixel openings 105R, 105G and 105B. In the case in which the segment electrodes 1024 are in contact with the regions at which the first line electrodes 1011 and the second line electrode 1012 intersect each other and the regions at which the third line electrodes 1021 and the fourth line electrodes 1022 intersect each other, the segment electrodes 1024 may be formed equidistantly from one another. Although the segment electrodes 1024 are formed of a transparent conductive material, they are not completely transparent, and accordingly, if the segment electrodes 1024 are not arranged equidistantly, there may occur a problem in that an image displayed on a screen is refracted or some of the segment electrodes 1024 are visible. Therefore, it is most advantageous for prevention of visibility of the segment electrodes 1024 to arrange the segment electrodes 1024 equidistantly from one another.

A second passivation layer 232 is disposed on the first mesh electrodes 101, the second mesh electrodes 102, the connecting patterns 1027 and the segment electrodes 1024. Accordingly, the first mesh electrodes 101, the second mesh electrodes 102, the connecting patterns 1027 and the segment electrodes 1024 are covered with the second passivation layer 232. An example is illustrated in FIG. 4, showing the case where the first mesh electrodes 101 and the segment electrodes 1024 are covered with the second passivation layer 232 disposed thereon. The second passivation layer 232 has contact holes CNT formed to expose a portion of the first mesh electrodes 101 therethrough.

The bridges 912b are formed on the second passivation layer 232. Therefore, the bridges 912b are spaced apart from the first and second mesh electrodes 101 and 102, and connect two neighboring first mesh electrodes 101a and 101b to each other through the contact holes CNT.

At this time, as shown in FIGS. 3 and 4, the bridges 912b do not overlap the second mesh electrodes 102, but overlap the connecting patterns 1027 so as to intersect the same. Accordingly, the overlapping area between the bridges 912b and the connecting patterns 1027 is minimized, and consequently, the occurrence of parasitic capacitance is minimized.

A third passivation layer 234 is disposed on the bridges 912b so as to cover the second passivation layer 232 and the bridges 912b. At this time, the second and third passivation layers 232 and 234 may have a single-layer structure formed of an inorganic film, for example, one of silicon oxide SiOx and silicon nitride SiNx, or may have a multi-layer structure formed by alternately stacking inorganic films, for example, SiOx and SiNx, one above another.

At this time, the touch electrode array 230 is formed in a manner such that the first mesh electrodes 101, the second mesh electrodes 102 and the connecting patterns 1027 are simultaneously formed on the buffer layer 220, the second passivation layer 232 having the contact holes CNT formed therein is subsequently formed thereon, the bridges 912b are subsequently formed so as to contact the contact holes CNT, and the third passivation layer 234 is subsequently formed on the bridges 912b. Subsequently, the organic light-emitting array 150 and the touch electrode array 230 are bonded to each other via the adhesive layer so as to be opposite each other. Accordingly, in practice, the touch electrode array 230 has a structure in which the second passivation layer 232 is disposed below the first mesh electrodes 101 and the second mesh electrodes 102, the bridges 912b are disposed thereunder, and the third passivation layer 234 is disposed thereunder.

Figure 5:
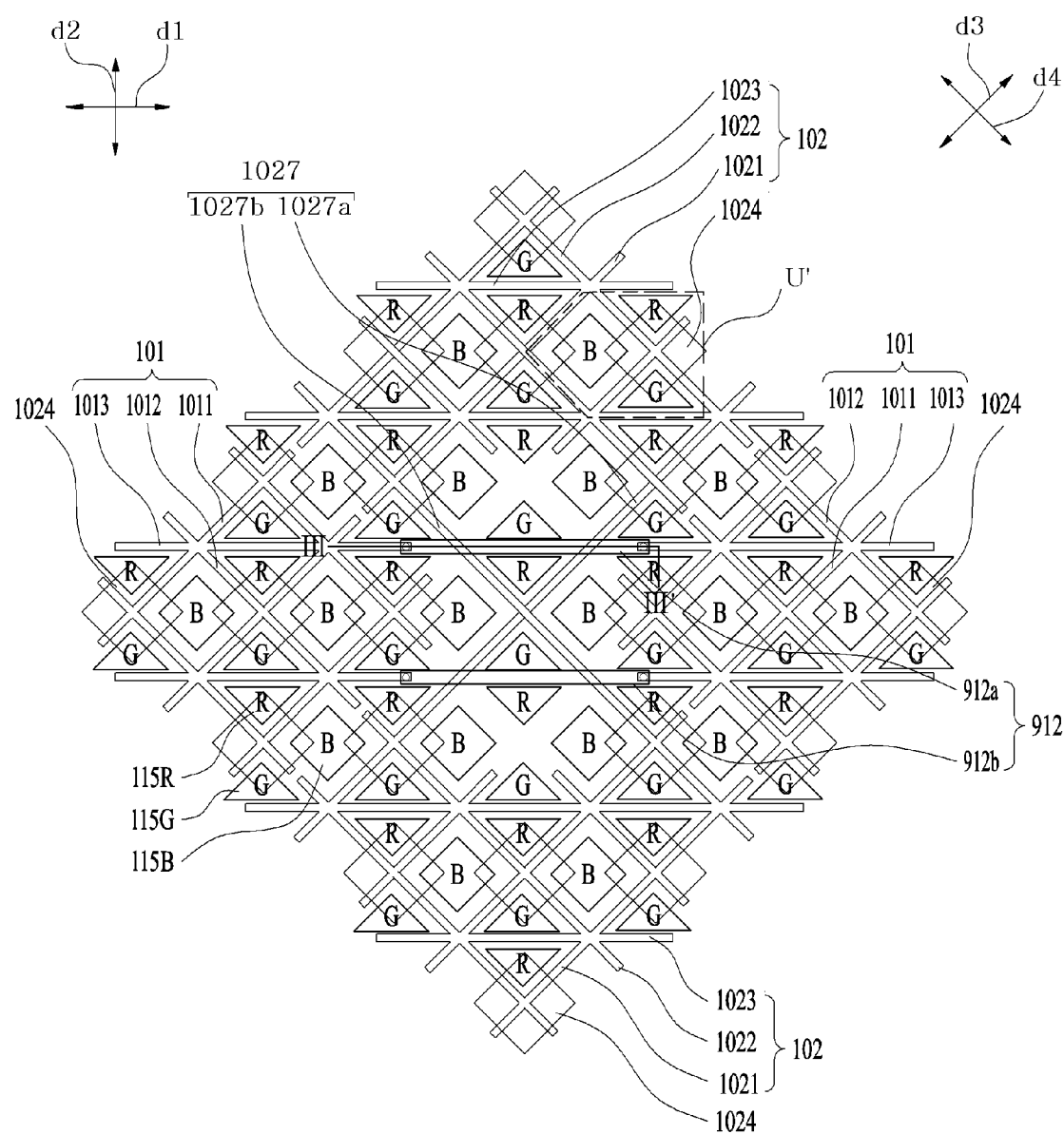
FIG. 5 is a schematic view for explaining the characteristics of first mesh electrodes, second mesh electrodes, bridges, and connecting patterns and the connection relationship there among according to a second embodiment of the present disclosure.

FIG. 5 is a schematic view for explaining the characteristics of first mesh electrodes 101, second mesh electrodes 102, bridges 912 and connecting patterns 1027 and the connection relationship thereamong according to a second embodiment of the present disclosure.

Referring to FIG. 5, each of the first mesh electrodes 101, as described above, includes first and second line electrodes 1011 and 1012, which are arranged in the third and fourth directions d3 and d4 so as to intersect each other, and further includes a plurality of fifth line electrodes 1013, which connect intersection points between the first line electrodes 1011 and the second line electrodes 1012 to each other in the first direction d1. The fifth line electrodes 1013 are formed so as to intersect the first and second line electrodes 1011 and 1012 so that the first mesh electrodes 101 have a shape that corresponds to the shape of the pixel openings 115R, 115G and 115B, which is modified to increase the resolution, which will be described later.

Each of the regions, which are defined by the intersection between the first and second line electrodes 1011 and 1012, is divided into two triangular-shaped regions by the fifth line electrodes 1013, specifically, is divided into a triangular-shaped region and an inverted-triangular-shaped region.

That is, the triangular-shaped region and the inverted-triangular-shaped region are defined by the intersection of the first, second and fifth line electrodes 1011, 1012 and 1013. The diamond-shaped region is defined by the intersection between the first and second line electrodes 1011 and 1012.

The fifth line electrodes 1013 may be arranged so as to be spaced apart from each other in the second direction d2, with a row of intersection points between the first line electrodes 1011 and the second line electrodes 1012 interposed therebetween. Accordingly, the quadrangular-shaped region, which is defined by the intersection between the first and second line electrodes 1011 and 1012, for example, the diamond-shaped region shown in FIG. 5, may be divided into two triangular-shaped regions by the fifth line electrodes 1013, or may keep its original shape within the area in which the fifth line electrodes 1013 are not present.

Each of the second mesh electrodes 102 includes third and fourth line electrodes 1021 and 1022, which are arranged in the third and fourth directions d3 and d4 so as to intersect each other, and further includes a plurality of sixth line electrodes 1023, which connect intersection points between the third line electrodes 1021 and the fourth line electrodes 1022 to each other in the first direction d1. Similar to the fifth line electrodes 1013, the sixth line electrodes 1023 enable the second mesh electrodes 102 to have a shape that corresponds to the shape of the pixel openings 115R, 115G and 115B, which is modified to increase the resolution, which will be described later.

Each of the regions defined by the intersection between the third and fourth line electrodes 1021 and 1022 is divided into two triangular-shaped regions by the sixth line electrodes 1023, specifically, is divided into a triangular-shaped region and an inverted-triangular-shaped region. That is, the triangular-shaped region and the inverted-triangular-shaped region are defined by the intersection of the third, fourth and sixth line electrodes 1021, 1022 and 1023. The diamond-shaped region is defined by the intersection between the third and fourth line electrodes 1021 and 1022.

The connecting patterns 1027 are formed so as to extend from the third and fourth line electrodes 1021 and 1022. Therefore, the connecting patterns 1027 may be formed in the same layer as the third and fourth line electrodes 1021 and 1022, i.e. the second mesh electrodes 102, using the same material. Each of the connecting patterns 1027 may include a first connecting line electrode 1027a, which extends in the same direction as the third line electrodes 1021, i.e. the third direction d3, and a second connecting line electrode 1027b, which extends in the same direction as the fourth line electrodes 1022, i.e. the fourth direction d4.

The connecting patterns 1027 are also positioned so as not to overlap the pixel openings 115R, 115G and 115B. Although not illustrated in FIG. 5, the first and second connecting line electrodes 1027a and 1027b, which compose the connecting patterns 1027, are provided in a plural number so as to intersect each other, thereby forming a mesh pattern. The mesh pattern of the connecting patterns 1027 is also provided so as not to overlap the pixel openings 115R, 115G and 115B.

The sixth line electrodes 1023 may be arranged so as to be spaced apart from each other in the second direction d2, with a row of intersection points between the third line electrodes 1021 and the fourth line electrodes 1022 interposed therebetween. Accordingly, the diamond-shaped region, which is defined by the intersection between the third and fourth line electrodes 1021 and 1022, may be divided into two triangular-shaped regions by the sixth line electrodes 1023, or may keep its original shape within the area in which the sixth line electrodes 1023 are not present.

Therefore, according to the second embodiment of the present invention, the diamond-shaped regions and the two triangular-shaped regions are defined in the display panel 100 by the first, second and fifth line electrodes 1011, 1012 and 1013 of the first mesh electrodes 101. Here, the two triangular-shaped regions, i.e. the triangular-shaped region and the inverted-triangular-shaped region, are positioned adjacent to each other in the second direction d2 such that the apexes thereof are opposite each other. The diamond-shaped regions and the two triangular-shaped regions, i.e. the inverted-triangular-shaped region and the triangular-shaped region, are positioned adjacent to each other in the first direction d1 in the manner of being alternately arranged in the first direction d1.

Further, according to the second embodiment of the present invention, in the same way as the first mesh electrodes 101, the diamond-shaped regions and the two triangular-shaped regions, which are defined by the third, fourth and sixth line electrodes 1021, 1022 and 1023 of the second mesh electrodes 102, are alternately arranged in the first direction d1.

Each of the pixel openings 105R, 105G and 105B is positioned so as to overlap a respective one of the two triangular-shaped regions and the diamond-shaped region. At this time, the blue pixel opening 105B for displaying a blue color, which has the lowest light-emitting efficiency among red, green and blue, may be positioned at the diamond-shaped region, and the red pixel opening 105R and the green pixel opening 105G may be positioned at the triangular-shaped region and the inverted-triangular-shaped region; however, the embodiment is not limited thereto.

In the organic light-emitting display device including the diamond-shaped pixel openings shown in FIG. 3, a unit pixel U is defined as including four neighboring sub-pixels, which are arranged in a diamond shape. Specifically, the unit pixel U is formed using four sub-pixels, which include the red, green and blue pixel openings 105R, 105G and 105B and additionally include any one of the red, green and blue pixel openings, for example, the red pixel opening 105R, as shown in FIG. 3.

Meanwhile, in the organic light-emitting display device including the diamond-shaped pixel openings and the triangular-shaped pixel openings shown in FIG. 5, a unit pixel U' is formed using one diamond-shaped sub-pixel and two triangular-shaped sub-pixels, each of which corresponds to a respective one of the red, green and blue pixel openings 105R, 105G and 105B. Accordingly, although the total number of sub-pixels is the same as in the organic light-emitting display device in FIG. 3, the organic light-emitting display device in FIG. 5 is capable of realizing more unit pixels U'. As a result, the organic light-emitting display device in FIG. 5 is more advantageous for the display of a high-resolution image.

The first to sixth line electrodes 1011, 1012, 1013, 1021, 1022 and 1023 of the first and second mesh electrodes 101 and 102 are disposed on the bank insulation film 15 so as to intersect each other and do not overlap the pixel openings 105R, 105G and 105B. Accordingly, the first and second mesh electrodes 101 and 102 are not visible to the user. The first to sixth line electrodes 1011, 1012, 1013, 1021, 1022 and 1023 may be formed of the same material and may be present in the same layer.

The segment electrodes 1024 are formed so as to overlap the intersection points between the first and second mesh electrodes 101 and 102. The segment electrodes 1024 are formed of a transparent conductive material such as, for example, ITO, IZO, ZnO or IGZO, and therefore may be formed so as to overlap a portion of the pixel openings 105R, 105G and 105B.

Since the first mesh electrodes 101 further include the fifth line electrodes 1013 and the second mesh electrodes 102 further include the sixth line electrodes 1023, the current path is increased, and accordingly, the resistance of the first and second mesh electrodes 101 and 102 is decreased.

The bridges 912a and 912b are formed between two neighboring first mesh electrodes 101a and 101b. Here, the bridges 912a and 912b are provided in a plural number. Although only two bridges are illustrated in FIG. 5 for convenience, the number of bridges 912a and 912b may be three or more depending on the design.

The bridges 912a and 912b connect two neighboring first mesh electrodes 101 to each other. At this time, the bridges 912a and 912b may be provided so as to connect the fifth line electrodes 1013 of the respective first mesh electrodes 101 to each other. At this time, a portion of the second mesh electrodes 102 that is positioned so as to overlap the bridges 912a and 912b is removed. That is, the bridges 912a and 912b and the second mesh electrodes 102 do not overlap each other. However, in order to connect neighboring second mesh electrodes 102 to each other, the connecting patterns 1027 include a portion that overlaps the bridges 912a and 912b. In order to minimize the overlapping area between the bridges 912a and 912b and the connecting patterns 1027, the connecting patterns 1027 overlap the bridges 912a and 912b in the manner of intersecting the same.

In other words, the bridges 912a and 912b are characterized in that they overlap only the connecting patterns 1027, out of the connecting patterns 1027 and the second mesh electrodes 102, so as to intersect the same. Therefore, in the in-cell touch organic light-emitting display device according to the present disclosure, as a result of the bridges 912a and 912b and the second mesh electrodes 102 not overlapping each other, parasitic capacitance does not occur between the bridges 912a and 912b and the second mesh electrodes 102. In addition, since the overlapping area between the second mesh electrodes 102 and the connecting patterns 1027 is minimized, the occurrence of parasitic capacitance is also minimized.

Figure 6:
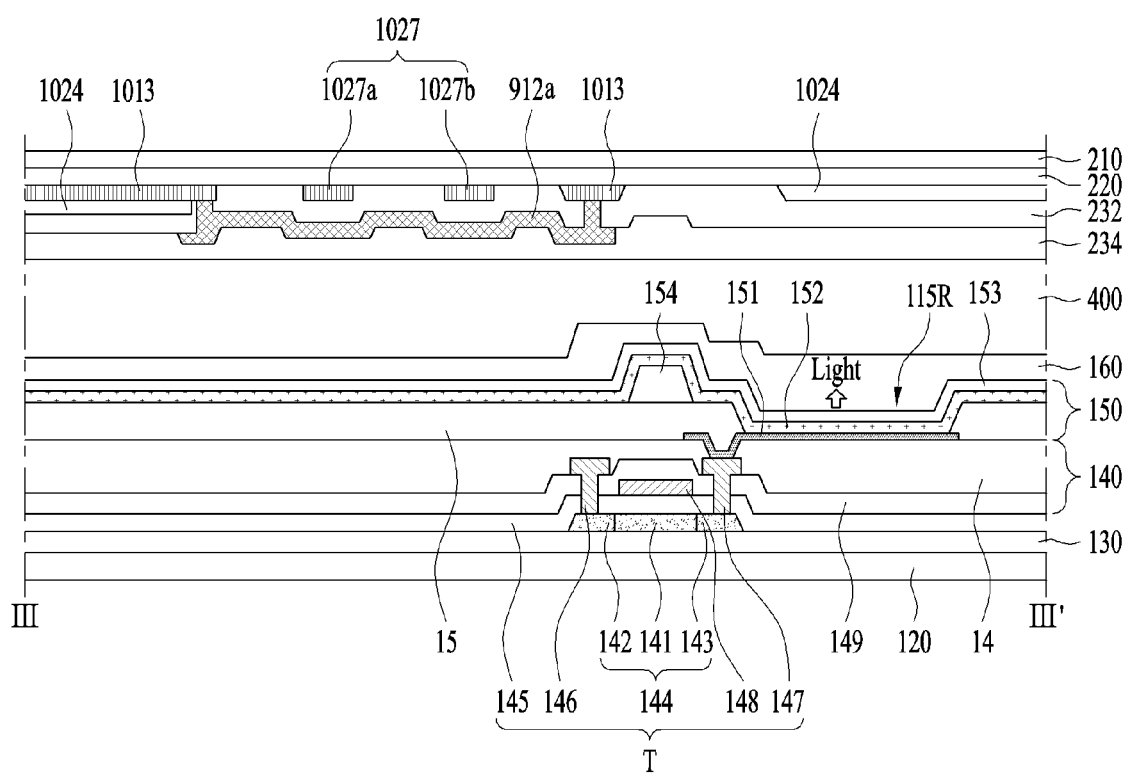
FIG. 6 is a sectional view for explaining the cross-sectional structure cut along line III-III' in FIG. 5 according to the present disclosure.

FIG. 6 is a sectional view for explaining the cross-sectional structure cut along line III-III' in FIG. 5.

In the second embodiment, since the structures of the thin-film transistor array 140, the organic light-emitting array 150, the protective layer 160 and the adhesive layer 400 are the same as those of the first embodiment, a detailed explanation thereof will be omitted.

The first mesh electrodes 101, the second mesh electrodes 102 and the connecting electrodes 1027 are disposed on the surface of the second buffer layer 120 that is opposite the organic light-emitting array 150. It is illustrated in FIG. 6 that the fifth line electrode 1013 of the first mesh electrodes 101 and the connecting patterns 1027 are disposed on the second buffer layer 120. Although not illustrated in FIG. 6, the second mesh electrodes 102 are also formed in the same layer as the first mesh electrodes 101 and the connecting patterns 1027 using the same material.

In the same way as the first embodiment, in the second embodiment, the first and second mesh electrodes 101 and 102 and the connecting patterns 1027 do not overlap the pixel openings 115R, but overlap the bank insulation film 15. It is illustrated in FIG. 6 that the first mesh electrodes 101 do not overlap the pixel openings 115R. Accordingly, the first mesh electrodes 101, the second mesh electrodes 102 and the connecting patterns 1027 are not visible to the user.

The segment electrodes 1024 are disposed on the first and second mesh electrodes 101 and 102 so as to be in contact therewith. The segment electrodes 1024 are positioned so as to be in contact with the intersection points at which at least two of the first, second and fifth line electrodes 1011, 1012 and 1013 intersect each other or the intersection points at which the third, fourth and sixth line electrodes 1021, 1022 and 1023 intersect each other.

Since the segment electrodes 1024 are formed of a transparent conductive material, it does not matter if the segment electrodes 1024 overlap the pixel openings 105R.

The first and second mesh electrodes 101 and 102 and the segment electrodes 1024 are covered with a second passivation layer 232. At this time, the first and second mesh electrodes 101 and 102 and the segment electrodes 1024 are completely covered with the second passivation layer 232. Referring to FIGS. 5 and 6, the second passivation layer 232 has contact holes CNT formed to expose a portion of the first mesh electrodes 101, specifically, a portion of the neighboring fifth line electrodes 1013, therethrough.

The bridges 912a are provided between two neighboring first mesh electrodes 101 on the first passivation layer 232, and are connected to the two first mesh electrodes 101 through the contact holes CNT, thereby electrically connecting the two neighboring first mesh electrodes 101 to each other. Referring to FIG. 5, the bridges 912a may be connected to the fifth line electrodes 1013 of the first mesh electrodes 101 and may be arranged parallel to the fifth line electrodes 1013 in the first direction d1; however, the embodiment is not limited thereto.

At this time, as shown in FIGS. 5 and 6, the bridges 912a do not overlap the second mesh electrodes 102 but overlap the connecting patterns 1027 so as to intersect the same. Accordingly, the overlapping area between the bridges 912a and the connecting patterns 1027 is minimized, and consequently, the occurrence of parasitic capacitance is minimized.

The bridges 912a have a structure that is covered with a third passivation layer 234. At this time, the second and third passivation layers 232 and 234 may have a single-layer structure formed of an inorganic film, for example, one of SiOx and SiNx, or may have a multi-layer structure formed by alternately stacking inorganic films, for example, SiOx and SiNx, one above another. The third passivation layer 234 may serve to protect the bridges 912a.

At this time, the touch electrode array 230 is formed in a manner such that the first mesh electrodes 101, the second mesh electrodes 102 and the connecting patterns 1027 are simultaneously formed on the buffer layer 220, the second passivation layer 232 having the contact holes CNT formed therein is subsequently formed thereon, the bridges 912b are subsequently formed so as to contact the contact holes CNT, and the third passivation layer 234 is subsequently formed on the bridges 912a. Subsequently, the organic light-emitting array 150 and the touch electrode array 230 are bonded to each other via the adhesive layer so as to be opposite each other. Accordingly, in practice, the touch electrode array 230 has a structure in which the second passivation layer 232 is disposed below the first mesh electrodes 101 and the second mesh electrodes 102, the bridges 912a are disposed thereunder, and the third passivation layer 234 is disposed thereunder.

As described above, the touch organic display device according to the present invention has an effect of preventing touch-sensing failure using a plurality of bridges 912a and 912b even though some of the bridges 912 are electrically disconnected, and has an effect of minimizing the occurrence of parasitic capacitance due to the bridges 912 by avoiding the overlap between the bridges 912 and the second mesh electrodes 102 and minimizing the overlap between the bridges 912 and the connecting patterns 1027.

The following Table 1 shows the comparison results between the touch-sensing performance of the touch organic light-emitting display device of the related art, in which two neighboring mesh electrodes are connected to each other via a plurality of bridges, and the touch-sensing performance of the touch organic light-emitting display device according to the present disclosure, in which two neighboring mesh electrodes are connected to each other via the same number of bridges as in the related art.

TABLE 1

| Classification | The Related Art | Present Disclosure |
| --- | --- | --- |
| C in Standby State (pF) | 2.5 | 1.4 |
| Change of C in Touch (pF) | 0.2 | 0.2 |
| Rate of Change (%) | 7 | 12 |
| Average Response Time (ns) | 665 | 629 |

In Table 1, C refers to capacitance. In the touch organic light-emitting display device of the prior art, the capacitance in a standby state is 2.5 pF. In the touch organic light-emitting display device according to the present disclosure, since a portion of the second mesh electrodes that overlaps the bridges is removed, the capacitance in a standby state is greatly reduced to 1.4 pF. Meanwhile, when a touch occurs, the change of capacitance in the present disclosure is the same as that in the related art. Accordingly, the rate of change of capacitance in the present disclosure, which has lower capacitance in the standby state, is higher than that in the related art by about 5%. Based on the observation that the touch sensitivity is increased in proportion to the rate of change of capacitance, it can be verified that the touch organic light-emitting display device according to the present invention has greatly improved touch-sensing characteristics.

Further, the response time of the touch organic light-emitting display device according to the present invention is greatly reduced, specifically by about 36 ns, compared to that in the related art. This results from a reduction in parasitic capacitance and consequent prevention of increase in a time constant (RC delay) due to the parasitic capacitance.

As is apparent from the above description, in a touch organic light-emitting display device according to the present disclosure, since two neighboring mesh electrodes are connected to each other via a plurality of bridges, even when one of the bridges is electrically disconnected, touch sensing is possible, and consequently, touch reliability is enhanced.

In addition, since a portion of the mesh electrodes that overlaps the bridges is removed, the occurrence of parasitic capacitance is prevented, and consequently, touch-sensing characteristics are greatly improved.

In addition, it is possible to prevent a delay of touch response time attributable to an increase in a time constant.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A touch organic light-emitting display device comprising:
    an organic light-emitting array including a plurality of pixel openings and a bank insulation film, the bank insulation film between the plurality of pixel openings; and
    a touch electrode array coupled to the organic light-emitting array, the touch electrode array including:
        a plurality of first mesh electrodes arranged in a first direction, the plurality of first mesh electrodes comprising a multiple-lattice structure;
        a plurality of second mesh electrodes in a same layer of the touch-organic light-emitting display device as the plurality of first mesh electrodes, the plurality of second mesh electrodes electrically insulated from the plurality of first mesh electrodes and arranged in a second direction that intersects the first direction, and the plurality of second mesh electrodes comprising a multiple-lattice structure;
        a plurality of bridges in a different layer of the touch-organic light-emitting display device from the plurality of first mesh electrodes, the plurality of bridges arranged in the first direction and electrically connecting together the plurality of first mesh electrodes via contact holes; and
        a plurality of connecting patterns arranged in the second direction, the plurality of connecting patterns electrically connecting together the plurality of second mesh electrodes, and
        wherein the plurality of bridges overlap the plurality of connecting patterns, but do not overlap the plurality of second mesh electrodes.

2. The touch organic light-emitting display device according to claim 1, wherein the plurality of first mesh electrodes, the plurality of second mesh electrodes, the plurality of bridges, and the plurality of connecting patterns are over the bank insulation film.

3. The touch organic light-emitting display device according to claim 2, wherein each of the plurality of first mesh electrodes includes a plurality of first line electrodes and a plurality of second line electrodes, the plurality of first line electrodes and the plurality of second line electrodes intersecting each other in a third direction and a fourth direction that are different from the first direction and second direction, the intersections of the plurality of first line electrodes and the plurality of second line electrodes forming a lattice structure,
    wherein each of the plurality of second mesh electrodes includes a plurality of third line electrodes and a plurality of fourth line electrodes, the plurality of third line electrodes and the plurality of fourth line electrodes intersecting each other in the third direction and the fourth direction, the intersections of the plurality of third line electrodes and the plurality of fourth line electrodes forming a lattice structure, and
    wherein the plurality of connecting patterns extend from the plurality of third line electrodes and the plurality of fourth line electrodes.

4. The touch organic light-emitting display device according to claim 3, wherein the plurality of pixel openings comprise a diamond shape.

5. The touch organic light-emitting display device according to claim 1, further comprising:
    a plurality of segment electrodes made of a conductive material, each segment electrode overlapping and connected to a portion of one of the plurality of first mesh electrodes or one of the plurality of second mesh electrodes.

6. The touch organic light-emitting display device according to claim 3, wherein each of the plurality of first mesh electrodes further includes a plurality of fifth line electrodes, the plurality of fifth line electrodes electrically connecting together intersection points between the plurality of first line electrodes and the plurality of second line electrodes in the first direction, and
    wherein each of the plurality of second mesh electrodes further includes a plurality of sixth line electrodes, the plurality of sixth line electrodes electrically connecting together intersection points between the plurality of third line electrodes and the plurality of fourth line electrodes to in the first direction.

7. The touch organic light-emitting display device according to claim 6, wherein each of the plurality of fifth line electrodes are spaced apart from other fifth line electrodes in the second direction with the intersection points between the plurality of first line electrodes and the plurality of second line electrodes interposed therebetween, and
    wherein the plurality of sixth line electrodes are spaced apart from other sixth line electrodes in the second direction with the intersection points between the plurality of third line electrodes and the plurality of fourth line electrodes interposed therebetween.

8. The touch organic light-emitting display device according to claim 7, wherein the plurality of bridges are connected to the plurality of fifth line electrodes through the contact holes.

9. The touch organic light-emitting display device according to claim 7, wherein the pixel openings include triangular-shaped pixel openings, inverted-triangular-shaped pixel openings, and diamond-shaped pixel openings.

10. The touch organic light-emitting display device according to claim 9, wherein the triangular-shaped pixel openings and the inverted-triangular-shaped pixel openings overlap intersections between the plurality of first line electrodes, the plurality of second line electrodes, and the plurality of fifth line electrodes or overlap intersections between the plurality of third line electrodes, the plurality of fourth line electrodes, and the plurality of sixth line electrodes.

11. The touch organic light-emitting display device according to claim 9, wherein the triangular-shaped pixel openings and the inverted-triangular-shaped pixel openings are configured to emit red light and green light, and
    the diamond-shaped pixel openings are configured to emit blue light.

12. The touch organic light-emitting display device according to claim 9, wherein the inverted-triangular-shaped pixel openings and the triangular-shaped pixel openings are adjacent to each other in the second direction and apexes of the inverted-triangular-shaped pixel openings are opposite to apexes of the triangular-shaped pixel openings, and the diamond-shaped pixel openings are adjacent to the inverted-triangular-shaped pixel openings and the triangular-shaped pixel openings in the first direction.

13. A touch electrode array comprising:
a plurality of first mesh electrodes arranged in a first direction, the plurality of first mesh electrodes comprising a multiple-lattice structure;
a plurality of second mesh electrodes in a same layer of the touch electrode array as the plurality of first mesh electrodes, the plurality of second mesh electrodes electrically insulated from the plurality of first mesh electrodes and arranged in a second direction that intersects the first direction, and the plurality of second mesh electrodes comprising a multiple-lattice structure;
a plurality of bridges in a different layer of the touch electrode array from the plurality of first mesh electrodes, the plurality of bridges arranged in the first direction and electrically connecting together the plurality of first mesh electrodes via contact holes; and
a plurality of connecting patterns arranged in the second direction, the plurality of connecting patterns electrically connecting together the plurality of second mesh electrodes, and
wherein the plurality of bridges overlap the plurality of connecting patterns, but do not overlap the plurality of second mesh electrodes.

14. The touch electrode array according to claim 13, wherein each of the plurality of first mesh electrodes includes a plurality of first line electrodes and a plurality of second line electrodes, the plurality of first line electrodes and the plurality of second line electrodes intersecting each other in a third direction and a fourth direction that are different from the first direction and second direction, the intersections of the plurality of first line electrodes and the plurality of second line electrodes forming a lattice structure,
wherein each of the plurality of second mesh electrodes includes a plurality of third line electrodes and a plurality of fourth line electrodes, the plurality of third line electrodes and the plurality of fourth line electrodes intersecting each other in the third direction and the fourth direction, the intersections of the plurality of third line electrodes and the plurality of fourth line electrodes forming a lattice structure, and
wherein the plurality of connecting patterns extend from the plurality of third line electrodes and the plurality of fourth line electrodes.

15. The touch electrode array according to claim 13, further comprising:
a plurality of segment electrodes made of a conductive material, each segment electrode overlapping and connected to a portion of one of the plurality of first mesh electrodes or one of the plurality of second mesh electrodes.

16. The touch electrode array according to claim 13, wherein each of the plurality of first mesh electrodes further includes a plurality of fifth line electrodes, the plurality of fifth line electrodes connecting together intersection points between the plurality of first line electrodes and the plurality of second line electrodes in the first direction, and
wherein each of the plurality of second mesh electrodes further includes a plurality of sixth line electrodes, the plurality of sixth line electrodes connecting together intersection points between the plurality of third line electrodes and the plurality of fourth line electrodes to in the first direction.

17. The touch electrode array according to claim 16, wherein each of the plurality of fifth line electrodes are spaced apart from other fifth line electrodes in the second direction with the intersection points between the plurality of first line electrodes and the plurality of second line electrodes interposed therebetween, and
wherein the plurality of sixth line electrodes are spaced apart from other sixth line electrodes in the second direction with the intersection points between the plurality of third line electrodes and the plurality of fourth line electrodes interposed therebetween.

18. A touch electrode array comprising:
a first plurality of mesh electrodes arranged in a first direction, the first plurality of mesh electrodes including a first mesh electrode and a second mesh electrode each having a lattice structure, the first mesh electrode not directly connected to the second mesh electrode;
a second plurality of mesh electrodes in a same layer of the touch electrode array as the first plurality of first mesh electrodes, the second plurality of second mesh electrodes electrically insulated from the first plurality of mesh electrodes and arranged in a second direction that intersects the first direction, and the second plurality of mesh electrodes including a lattice structure; and
a plurality of bridges in a different layer of the touch electrode array from the plurality of first mesh electrodes, the plurality of bridges including a first bridge and a second bridge, the first bridge and the second bridge electrically connecting together the first mesh electrode and the second mesh electrode; and
a passivation layer between the plurality of first mesh electrodes and the plurality of bridges.

19. The touch electrode array according to claim 18, further comprising:
a plurality of connecting patterns arranged in the second direction, the plurality of connecting patterns electrically connecting together the plurality of second mesh electrodes, and
wherein the plurality of bridges overlap the plurality of connecting patterns, but do not overlap the plurality of second mesh electrodes.

* * * * *